United States Patent
Hung et al.

(10) Patent No.: US 9,209,293 B2
(45) Date of Patent: Dec. 8, 2015

(54) INTEGRATED DEVICE HAVING MOSFET CELL ARRAY EMBEDDED WITH BARRIER SCHOTTKY DIODE

(71) Applicant: Industrial Technology Research Institute, Hsinchu (TW)

(72) Inventors: Chien-Chung Hung, Hsinchu (TW); Young-Shying Chen, Hsinchu (TW); Cheng-Tyng Yen, Kaohsiung (TW); Chwan-Ying Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 18 days.

(21) Appl. No.: 13/865,980

(22) Filed: Apr. 18, 2013

(65) Prior Publication Data
US 2014/0175559 A1  Jun. 26, 2014

(30) Foreign Application Priority Data
Dec. 20, 2012 (TW) .............................. 101148799 A

(51) Int. Cl.
*H01L 29/76* (2006.01)
*H01L 29/78* (2006.01)
*H01L 29/06* (2006.01)
*H01L 29/10* (2006.01)
*H01L 29/16* (2006.01)

(52) U.S. Cl.
CPC ........ *H01L 29/7806* (2013.01); *H01L 29/0696* (2013.01); *H01L 29/1095* (2013.01); *H01L 29/7813* (2013.01); *H01L 29/1608* (2013.01)

(58) Field of Classification Search
CPC .............. H01L 29/872; H01L 29/8275; H01L 29/1306; H01L 29/1095; H01L 27/088; H01L 27/0727
See application file for complete search history.

(56) References Cited

U.S. PATENT DOCUMENTS 4,811,065 A   3/1989 Cogan
5,111,253 A   5/1992 Korman et al.
(Continued)

FOREIGN PATENT DOCUMENTS

CN  202003996   10/2011
TW  201108394   3/2011

OTHER PUBLICATIONS

K. Sheng et al., A Vertical SiC JFET with a Monolithically Integrated JBS Diode, International Symposium on Power Semiconductors Devices & IC's, 2009, ISPSD 2009, pp. 255-258.*
(Continued)

*Primary Examiner* — Jesse Y Miyoshi
*Assistant Examiner* — Stephen C Smith
(74) *Attorney, Agent, or Firm* — Jianq Chyun IP Office

(57) ABSTRACT

Provided is an integrated device having a MOSFET cell array embedded with a junction barrier Schottky (JBS) diode. The integrated device comprises a plurality of areas, each of which includes a plurality of MOS transistor cells and at least one JBS diode. Any two adjacent MOS transistor cells are separated by a separating line. A first MOS transistor cell and a second MOS transistor cell are adjacent in a first direction and separated by a first separating line, and the first transistor cell and a third MOS transistor cell are adjacent in a second direction and separated by a second separating line. The JBS diode is disposed at an intersection region between the first separating line and the second separating line. The JBS diode is connected in anti-parallel to the first, second and third MOS transistor cells.

17 Claims, 13 Drawing Sheets

(56) References Cited

U.S. PATENT DOCUMENTS

| | | |
|---|---|---|
| 6,331,455 B1 | 12/2001 | Rodov et al. |
| 6,351,018 B1 | 2/2002 | Sapp |
| 6,593,620 B1 | 7/2003 | Hshieh et al. |
| 6,621,107 B2 * | 9/2003 | Blanchard et al. ............ 257/155 |
| 6,979,863 B2 | 12/2005 | Ryu |
| 7,416,929 B2 | 8/2008 | Mazzola et al. |
| 7,504,306 B2 | 3/2009 | Sapp et al. |
| 7,728,402 B2 | 6/2010 | Zhang et al. |
| 7,741,693 B1 | 6/2010 | Dyer |
| 7,745,878 B2 | 6/2010 | Bhalla et al. |
| 7,808,223 B1 | 10/2010 | Khanna et al. |
| 7,994,513 B2 | 8/2011 | Yamamoto et al. |
| 8,110,869 B2 * | 2/2012 | Bhalla ........................ 257/328 |
| 8,471,332 B2 * | 6/2013 | Bhalla et al. ................. 257/330 |
| 2002/0019115 A1 | 2/2002 | Rodov et al. |
| 2006/0202264 A1 * | 9/2006 | Bhalla et al. ................. 257/330 |
| 2009/0072301 A1 | 3/2009 | Bhalla et al. |
| 2011/0156810 A1 * | 6/2011 | Girdhar et al. ............... 327/566 |

OTHER PUBLICATIONS

Uchida et al., "Novel SiC Power MOSFET with Integrated Unipolar Internal Inverse MOS-Channel Diode," IEEE International Electron Devices Meeting (IEDM), Dec. 5-7, 2011, pp. 26.6.1-26.6.4.

Zhu et al., "Design, Fabrication, and Characterization of Low Forward Drop, Low Leakage, 1-kV 4H-SiC JBS Rectifiers," IEEE Transactions on Electron Devices 53(2), Feb. 2006, pp. 363-368.

Nakamura et al., "Development of SiC diodes, power MOSFETs and intelligent power modules," Physics Status Solidi A 206(10), Oct. 2009, pp. 2403-2416.

Baliga et al., "Paradigm Shift in Planar Power MOSFET Technology," Power Electronics Technology, Nov. 2003, pp. 24-32.

Sheng et al., "A Vertical SiC JFET with a Monolithically Integrated JBS Diode," 21st International Symposium on Power Semiconductor Devices & IC's (ISPSD), Jun. 14-18, 2009, pp. 255-258.

"Office Action of Taiwan Counterpart Application", issued on Jul. 27, 2015, p. 1-7.

* cited by examiner

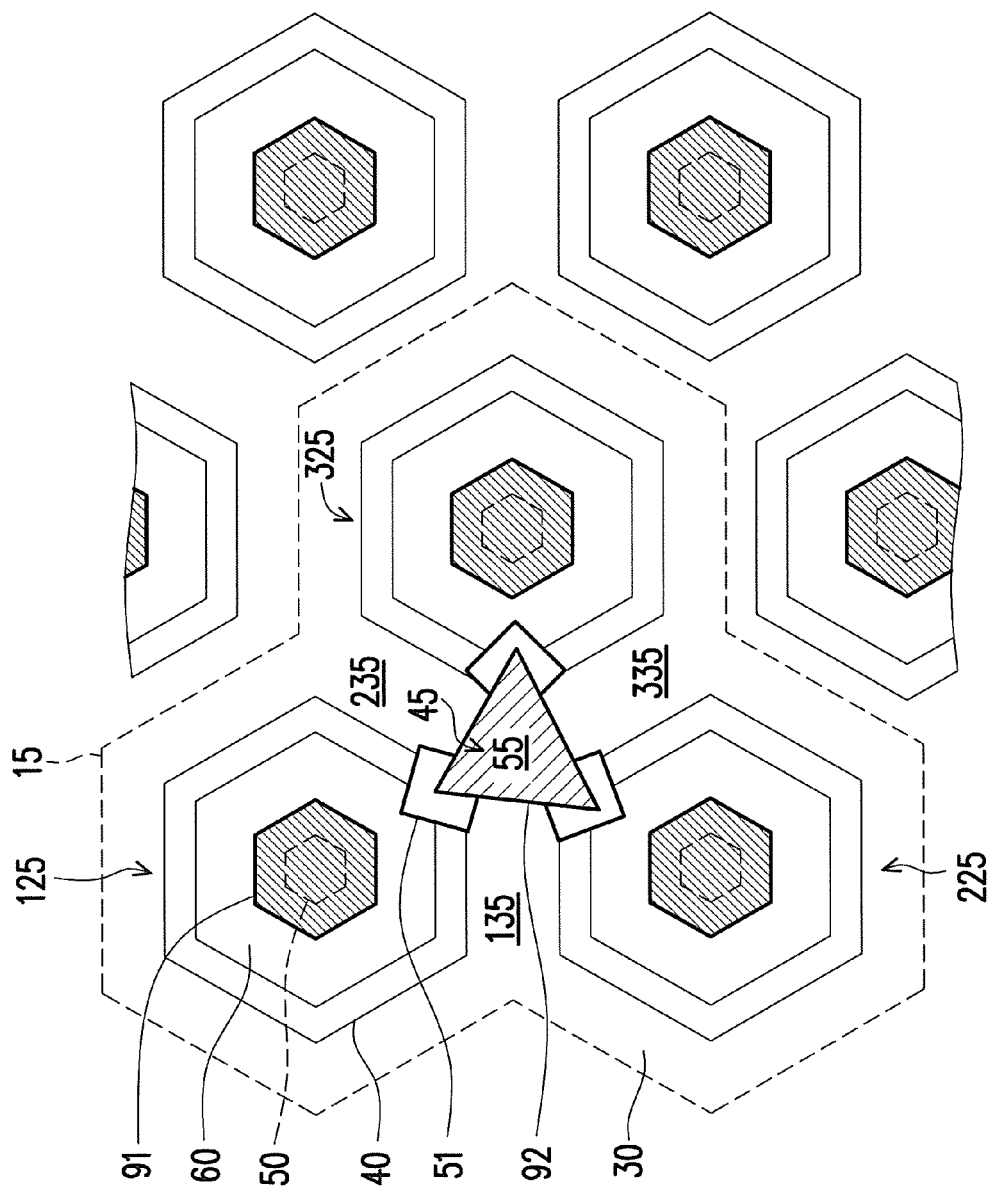

INTEGRATED DEVICE HAVING MOSFET CELL ARRAY EMBEDDED WITH BARRIER SCHOTTKY DIODE

CROSS-REFERENCE TO RELATED APPLICATION

This application claims the priority benefit of Taiwan application serial no. 101148799, filed on Dec. 20, 2012. The entirety of the above-mentioned patent application is hereby incorporated by reference herein and made a part of this specification.

BACKGROUND

1. Technical Field

The technical field relates to an integrated device having a metal oxide semiconductor field effect transistor (MOSFET) cell array embedded with a junction barrier Schottky (JBS) diode.

2. Background

In order to achieve standards of low carbon emission and high energy efficiency, power devices are more and more important in electronic products and power supply systems. In the green energy industries, such as electric vehicle (EV)/hybrid electric vehicle (HEV) industries, distributed power and smart grid industries, and wind power and photo voltaic (PV) system industries, power consuming and energy conversion efficiency of devices are critical in power saving. The Si-based devices (e.g. Si-SBD, Si-MOSFET, Si-IGBT etc.) are adopted in these applications. However, such devices have high thermal resistivity and thus heat dissipation becomes a problem. The heat sink modules of such devices occupy a relatively large space in the systems. Moreover, such devices have poor turn-on and high switching energy loss.

Since wide-band-gap materials such as silicon carbide (SiC) have high thermal conductivity which is three times the thermal conductivity of silicon, the wide-band-gap materials can be operated normally in a higher temperature condition and are beneficial to the compact systematization of heat sink modules. In addition, SiC has a high withstand voltage and a high critical breakdown field, and a withstand voltage layer can have a higher concentration and a smaller thickness in the devices, such that the devices using SiC have lower resistance and therefore lower turn-on loss. Moreover, because the intrinsic carrier concentration (Ni) of SiC is lower than that of Si, SiC has a lower current leakage characteristic and a short response time almost near zero, and thus, lower switching loss is generated. Generally, half power consumption of the power system can be effectively saved when SiC devices replace Si devices.

In the key motor drivers of EV/HEV for medium-to-high power applications, and in the key PV inverters of PV/smart grid for high power applications, MOS transistor switches and diode devices such as Schottky barrier diodes (SBD) or junction barrier Schottky diodes (JBS) are provided in their power modules. These devices have voltage ratings from 600V, 1,200V to 1,700V. In the market, a hybrid module combining Si-IGBT and SiC-diode replaces the traditional module only containing Si devices, so as to reduce the power consumption and decrease the volume of the whole module. However, in the said hybrid module, Si-IGBT is a bipolar switching device, in which higher switching power loss occurs because the reverse recovery current thereof cannot quickly dissipate. Therefore, a SiC device is required to replace the key Si-IGBT. The most feasible device is SiC-MOSFET, which can be categories into a lateral channel structure referred to as SiC-DMOSFET and a vertical channel structure referred to as SiC-UMOSFET. SiC-MOSFET is a majority carrier switching device having a quick switching speed. In the conventional fabricating method of such power module, MOSFET and SBD (or MOSFET and JBS) are fabricated on separate chips and then packaged together, in which many wirings are required and the stray inductance is accordingly increased. Moreover, with such conventional method, greater space and therefore higher production cost are required.

SUMMARY

One of exemplary embodiments comprises an integrated device having a metal oxide semiconductor field effect transistor (MOSFET) cell array embedded with a junction barrier Schottky (JBS) diode. The integrated device comprises a plurality of areas, each of which comprises a plurality of MOS transistor cells and at least one JBS diode. Any two adjacent transistor cells are separated by a separating line. A first MOS transistor cell and a second MOS transistor cell are adjacent in a first direction and separated by a first separating line, and the first transistor cell and a third MOS transistor cell are adjacent in a second direction and separated by a second separating line. The at least one JBS diode is disposed at an intersection region between the first separating line and the second separating line, wherein the JBS diode is connected in anti-parallel to the first, second and third MOS transistor cells.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 2B is schematic view of a localized region in FIG. 1B.

DETAILED DESCRIPTION OF DISCLOSED EMBODIMENTS

Figure 1A:
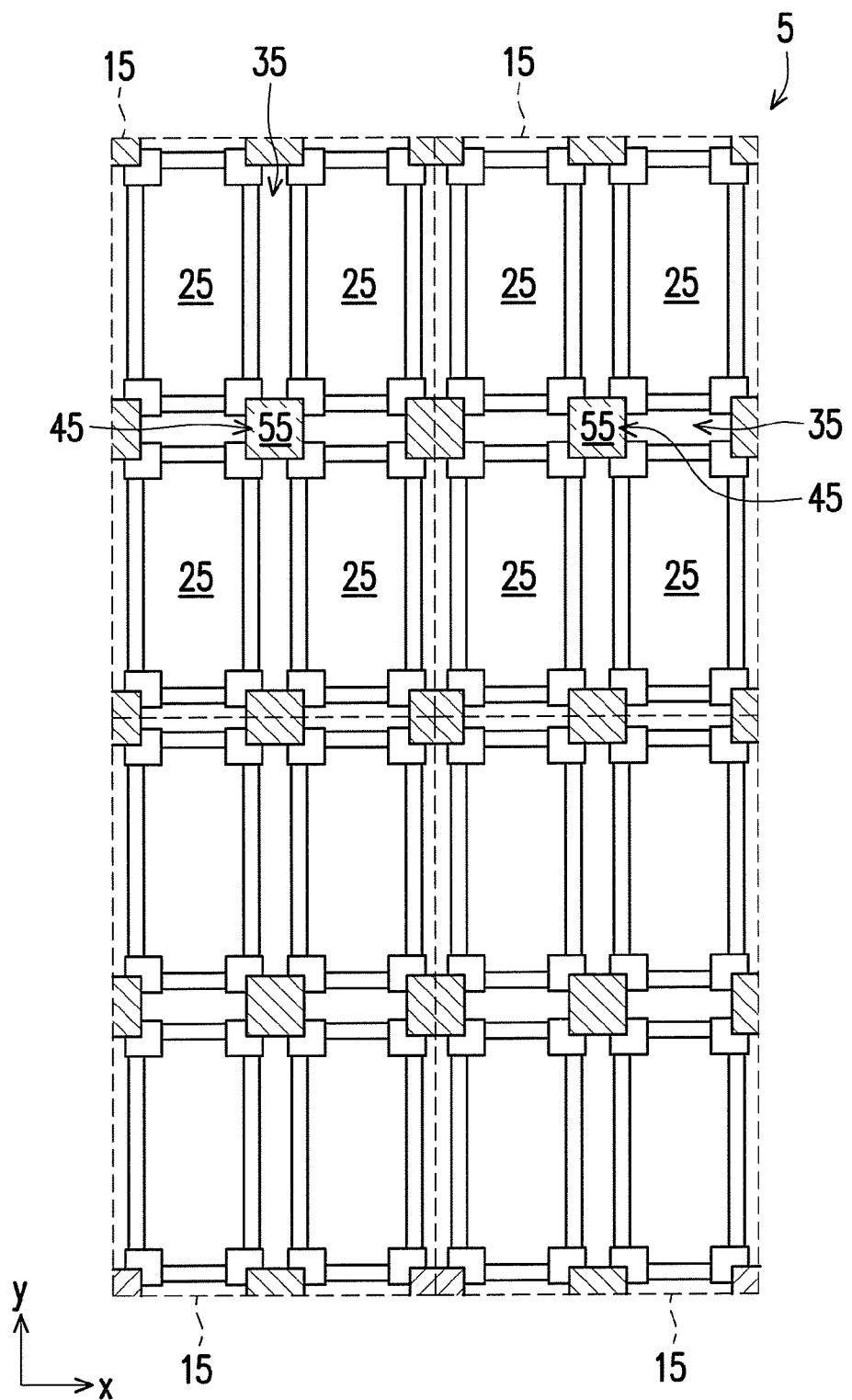
FIG. 1A is a simplified top view of an integrated device having a MOSFET cell array embedded with a JBS diode according to an exemplary embodiment.
Figure 1B:
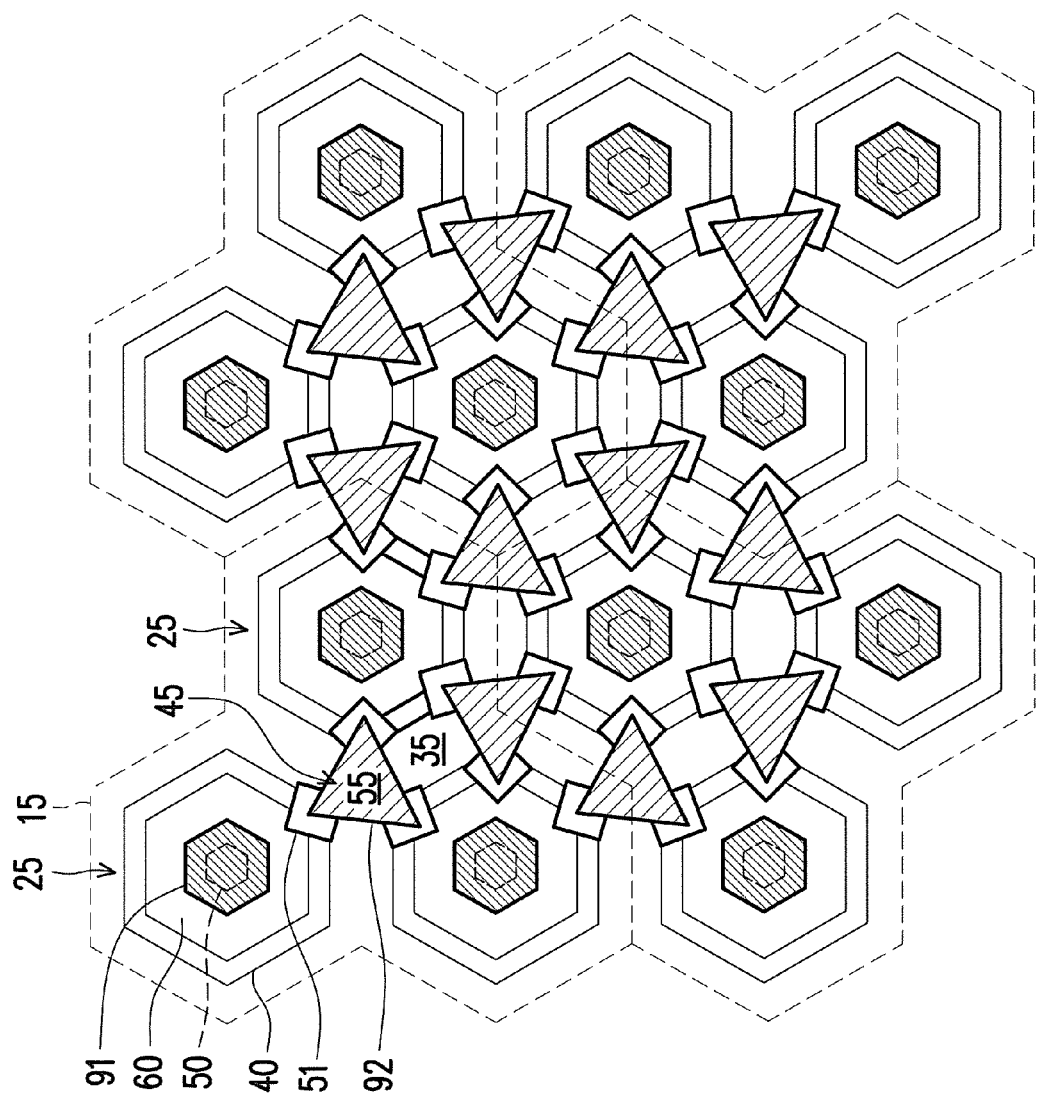
FIG. 1B is a simplified top view of an integrated device having a MOSFET cell array embedded with a JBS diode according to another exemplary embodiment.

FIG. 1A is a simplified top view of an integrated device having a MOSFET cell array embedded with a JBS diode according to an exemplary embodiment. FIG. 1B is a simplified top view of an integrated device having a MOSFET cell array embedded with a JBS diode according to another exemplary embodiment.

Referring to FIG. 1A and FIG. 1B, an integrated device 5 having a MOSFET cell array embedded with a JBS diode comprises a plurality of areas 15. Each area 15 comprises a plurality of MOS transistor cells 25 arranged in an array and at least one JBS diode 45. The at least one JBS diode 45 is connected in anti-parallel to the MOS transistor cells 25.

The MOS transistor cells 25 are arranged in an array. Each MOS transistor cell 25 can be rectangular, hexagonal, octagonal, circular or elliptic. Any two adjacent MOS transistor cells 25 are separated by a separating line 35. The MOS transistor cells 25 can be SiC MOS transistor cells.

Each JBS diode 45 can replace the parts of the adjacent MOS transistor cells 25 which have a non-uniform threshold voltage (Vt) characteristic. For example, the JBS diode 45 can be disposed within the region surrounded by the corners of the adjacent MOS transistor cells 25, but the disclosure is not limited thereto.

In an embodiment, the JBS didoes 45 can be disposed at intersection regions 55 of the separating lines 35. The separating lines 35 can be referred to as junction field effect transistor (JFET) regions. From another point of view, each JBS diode 45 can be disposed within the region surrounded by the corners of the adjacent MOS transistor cells 25 (i.e. within the corresponding intersection region 55). The JBS diodes 45 can be positioned not only at the intersection regions 55 of the separating lines 35 in the same area 15, but also at the intersection regions 55 of the separating lines 35 between the adjacent MOS transistor cells 25 in the adjacent areas 15.

In an embodiment, the area of each JBS diode 45 is ¼ to ½ the area of each MOS transistor cell 45. Generally, each MOS transistor cell 25 has a low-mobility channel and exhibits a specific resistance of about 10-20 mOhm-cm$^2$. However, each JBS diode 45 does not have the channel region of the MOS transistor cell 25 and exhibits a specific resistance of 2-5 mOhm-cm$^2$. In the case that each JBS diode 45 and each MOS transistor cell 25 are fabricated to have the same area, the provided current of the JBS diode 45 is much higher than that of the MOS transistor cell 25, which is not necessary for practical application. In an embodiment of the disclosure, each JBS diode 45 between the adjacent MOS transistor cells 25 in each area 15 is designed to have a smaller area, so that the area of the JBS diode 45 is less than that of each MOS transistor cell 25. In such manner, the current of the JBS diode 45 matches with that of the MOS transistor cell 25, and the area equivalent to the area for the MOS transistor cell 25 is not required when the the JBS diode 45 is fabricated. The JBS diode 45 can be even disposed at the intersection region 55 of the separating lines 35 without occupying the original areas of the MOS transistor cells 25, and thus, the chip area for the JBS diode 45 can be saved.

Figure 2A:
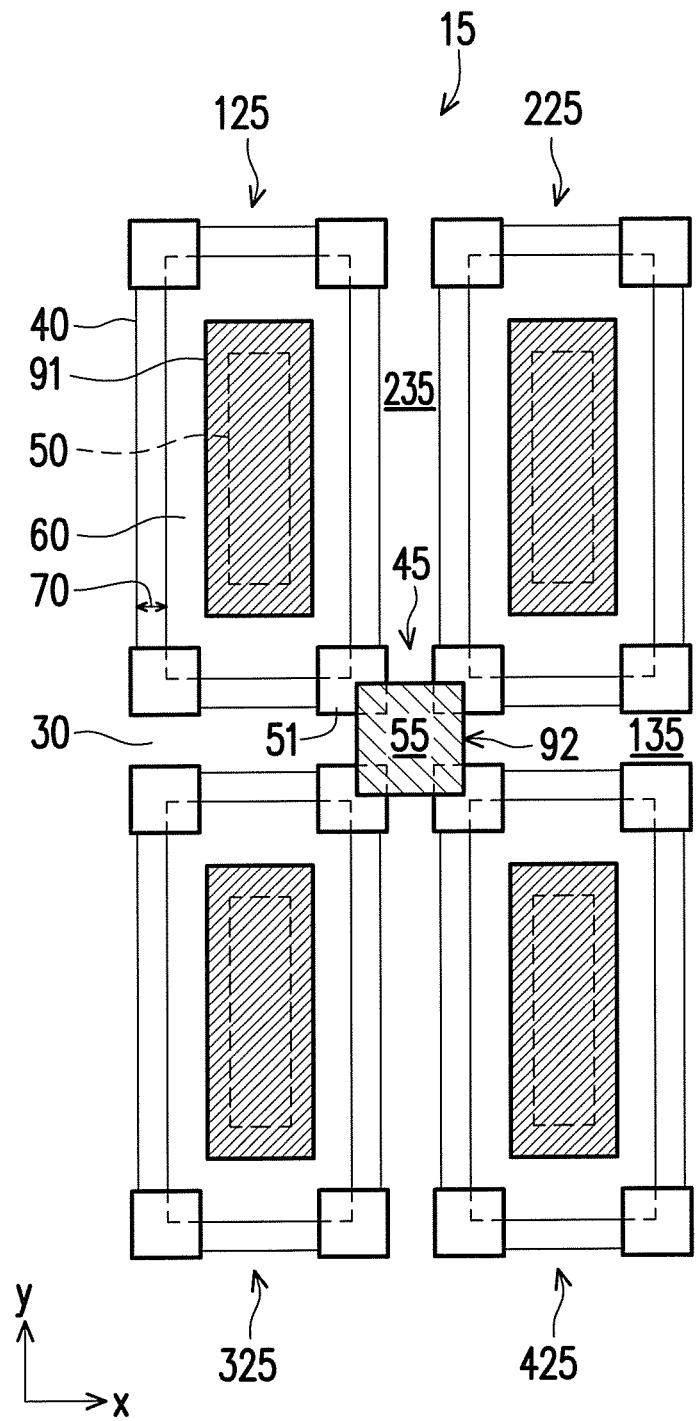
FIG. 2A is schematic view of a localized region in FIG. 1A.

FIG. 2A is schematic view of a localized region in FIG. 1A. FIG. 2B is schematic view of a localized region in FIG. 1B. For clarity of illustration, FIG. 2A and FIG. 2B are simplified, in which the JBS diode 45 is illustrated only at the center of each area 15. The JBS diodes 45 can be positioned not only at the intersection regions 55 of the separating lines 35 in the same area 15, but also at the intersection regions 55 of the separating lines 35 between the adjacent MOS transistor cells 25 in the adjacent areas 15, as shown in FIG. 1A and FIG. 1B.

Referring to FIG. 2A, in an embodiment, each area 15 comprises four MOS transistor cells (i.e. first to fourth MOS transistor cells 125, 225, 325 and 425), two separating lines (i.e. first and second separating lines 135 and 235) and one JBS diode 45. Specifically, the first MOS transistor cell 125 and the third MOS transistor cell 325 are adjacent in a first direction (e.g. Y-direction) and separated by the first separating line 135; the second MOS transistor cell 225 and the fourth MOS transistor cell 425 are adjacent in the first direction and separated by the first separating line 135; the first MOS transistor cell 125 and the second MOS transistor cell 225 are adjacent in a second direction (e.g. X-direction) and separated by the second separating line 235; and the third MOS transistor cell 325 and the fourth MOS transistor cell 425 are adjacent in the second direction and separated by the second separating line 235.

The JBS diode 45 is disposed at the intersection region 55 of the first separating line 135 and the second separating line 235. The JBS diode 45 is connected in anti-parallel to the first to fourth MOS transistor cells 125, 225, 325 and 425. The anode contact 92 of the JBS diode 45 is electrically connected to the source contacts 91 of the first to fourth MOS transistor cells 125, 225, 325 and 425 via conductive lines (not shown). The cathode (not shown) of the JBS diode 45 is electrically connected to the drain region (not shown) of the first to fourth MOS transistor cells 125, 225, 325 and 425 so as to form a common terminal.

Referring to FIG. 2B, in another embodiment, each area 15 comprises three MOS transistor cells (i.e. first to third MOS transistor cells 125, 225 and 325), three separating lines (i.e. first to third separating lines 135, 235 and 335) and one JBS diode 45. Specifically, the first MOS transistor cell 125 and the second MOS transistor cell 225 are separated by the first separating line 135; the first MOS transistor cell 125 and the third MOS transistor cell 325 are separated by the second separating line 235; and the second MOS transistor cell 225 and the third MOS transistor cell 325 are separated by the third separating line 335. The JBS diode 45 is disposed at the intersection region 55 of the first to third separating lines 135, 235 and 335. The JBS diode 45 is connected in anti-parallel to the first to third MOS transistor cells 125, 225 and 325. The anode contact 92 of the JBS diode 45 is electrically connected to the source contacts 91 of the first to third MOS transistor cells 125, 225 and 325 via conductive lines (not shown). The cathode (not shown) of the JBS diode 45 is electrically connected to the drain region (not shown) of the first to third MOS transistor cells 125, 225 and 325 so as to form a common terminal.

Figure 3A:
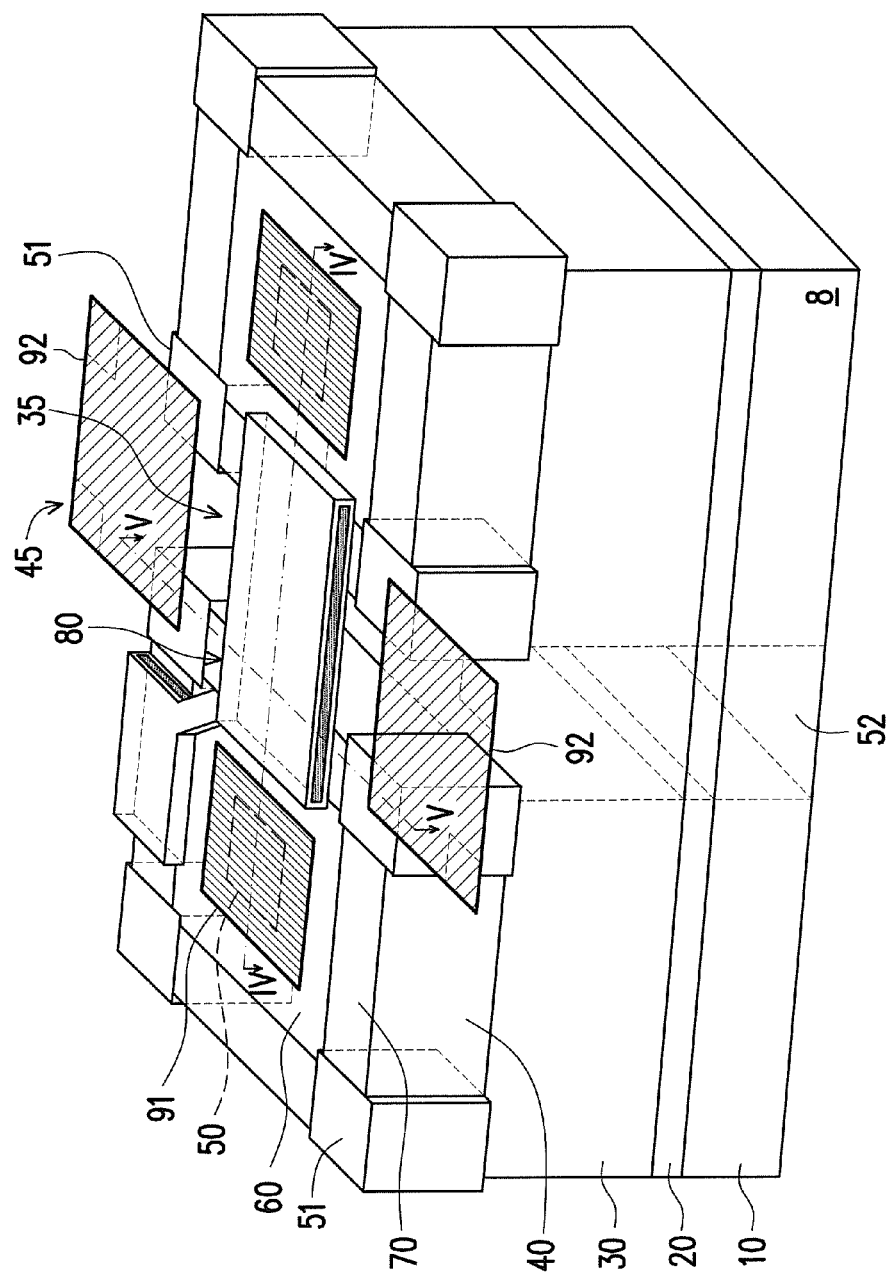
FIG. 3A is a three-dimensional view of a localized region of the intergrated device in FIG. 1A, in which a MOSFET cell array is embedded with a JBS diode.
Figure 3B:
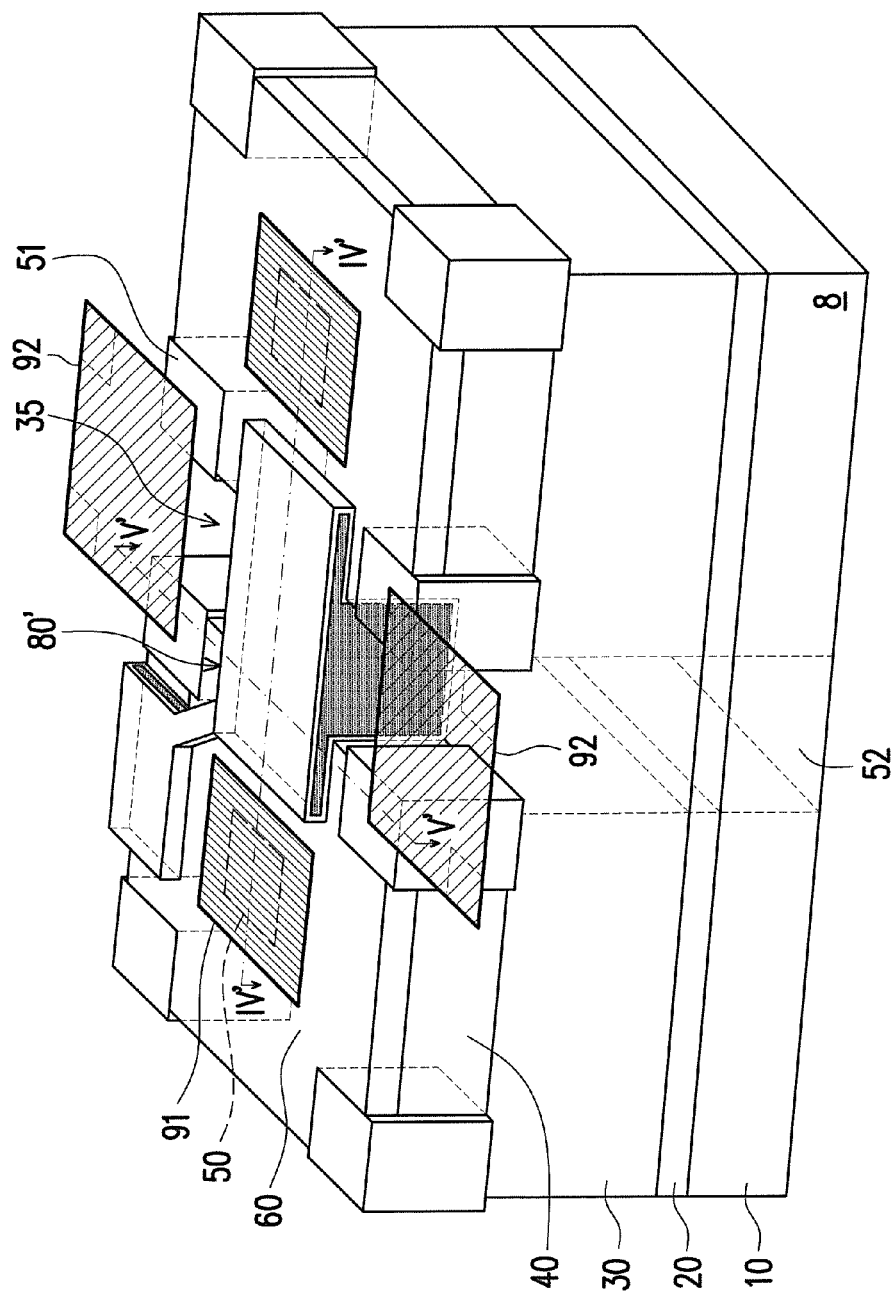
FIG. 3B is a three-dimensional view of a localized region of the intergrated device of FIG. 1A, in which a trench gate MOS transistor cell array is embedded with a JBS diode.
Figure 4A:
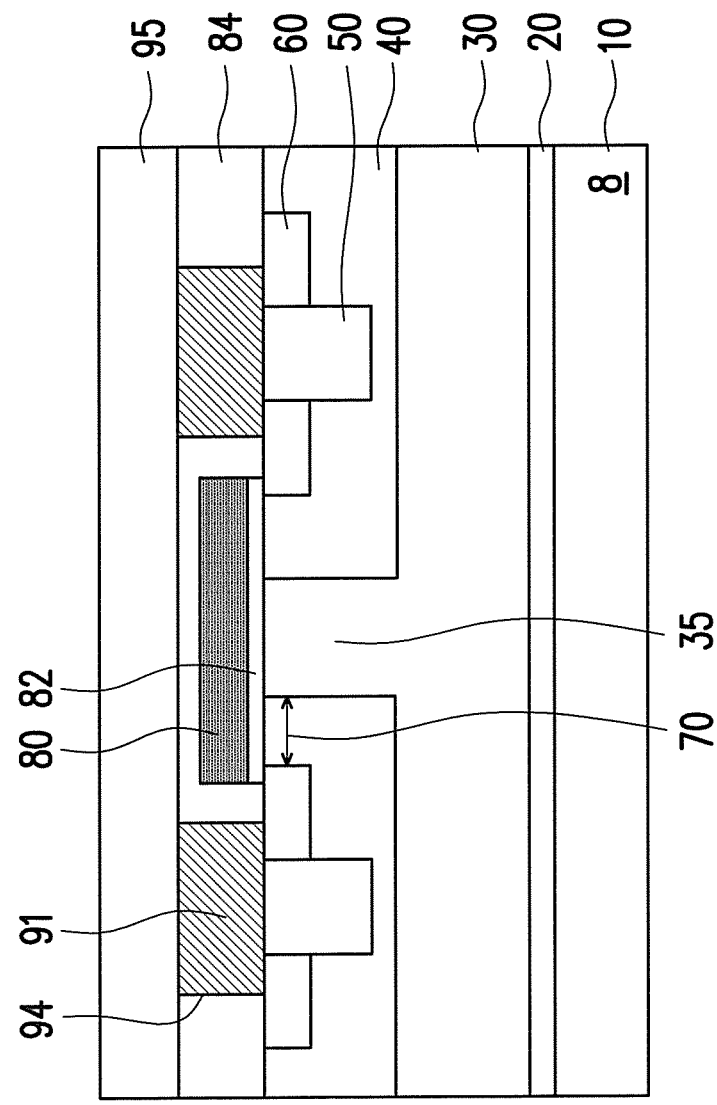
FIG. 4A is a cross-sectional view taken along the line IV-IV in FIG. 3A.
Figure 4B:
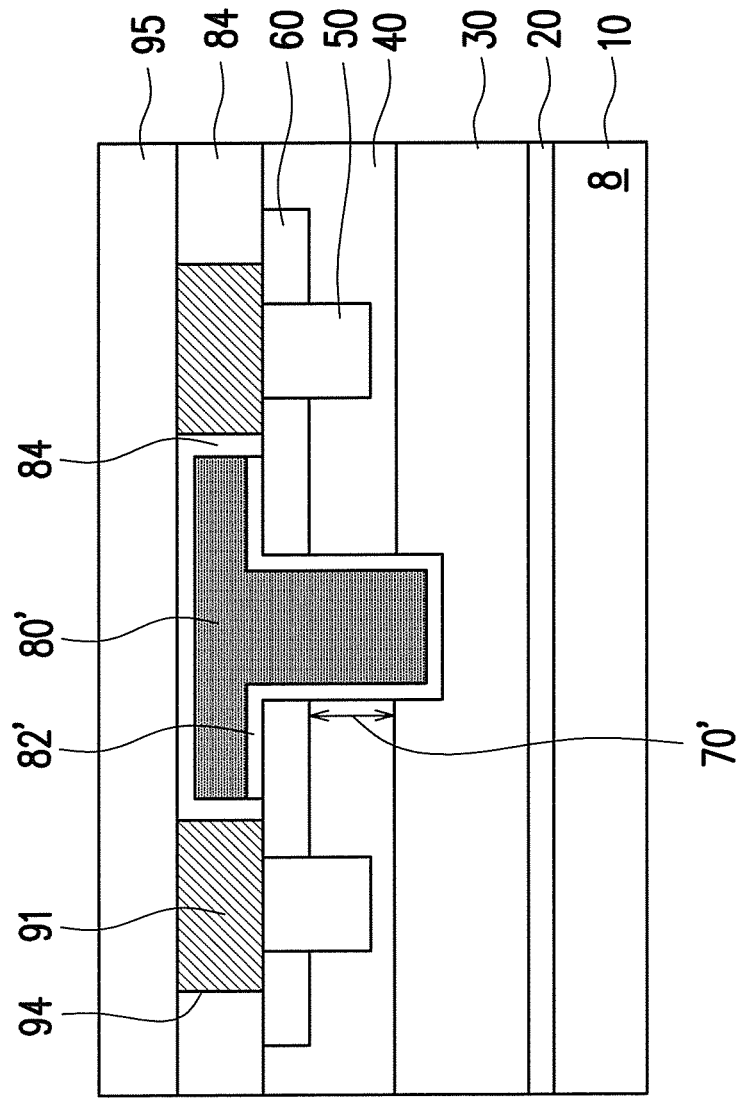
FIG. 4B is a cross-sectional view taken along the line IV'-IV' in FIG. 3B.

FIG. 3A is a three-dimensional view of a localized region of the intergrated device in FIG. 1A, in which a MOSFET cell array is embedded with a JBS diode. FIG. 3B is a three-dimensional view of a localized region of the intergrated device of FIG. 1A, in which a trench gate MOS transistor cell array is embedded with a JBS diode. FIG. 4A is a cross-sectional view taken along the line IV-IV in FIG. 3A. FIG. 4B is a cross-sectional view taken along the line IV'-IV' in FIG.

Figure 5A:
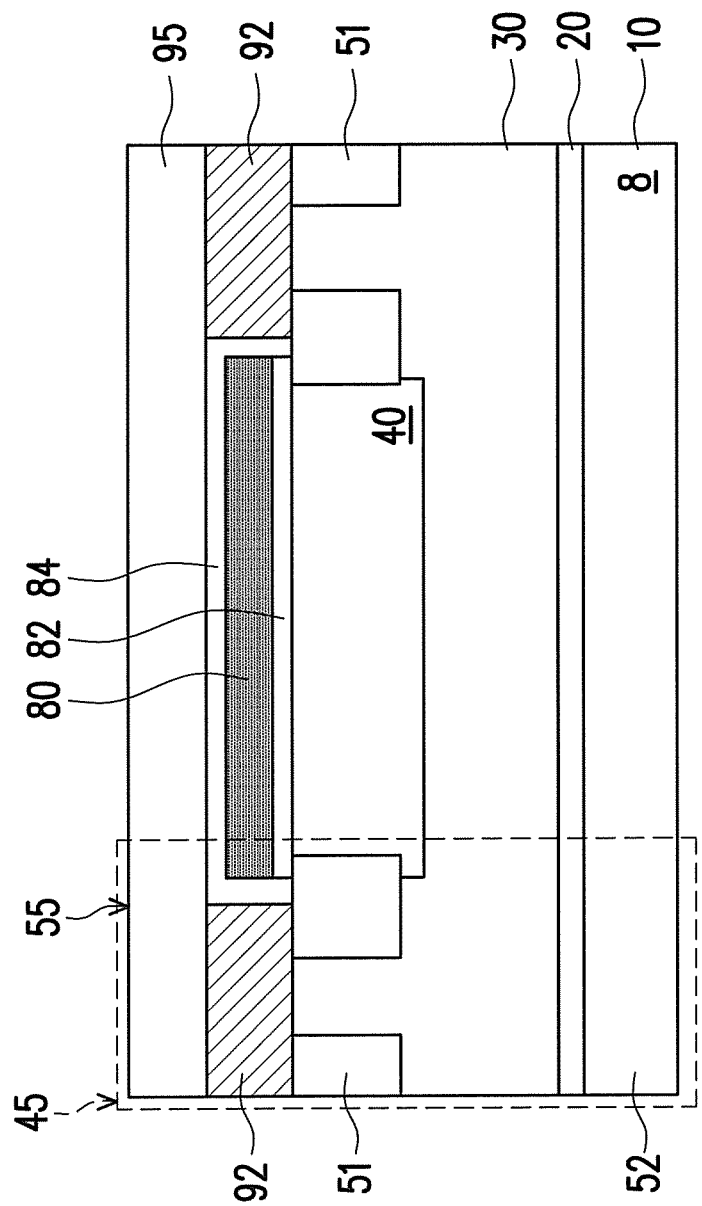
FIG. 5A is a cross-sectional view taken along the line V-V in FIG. 3A.
Figure 5B:
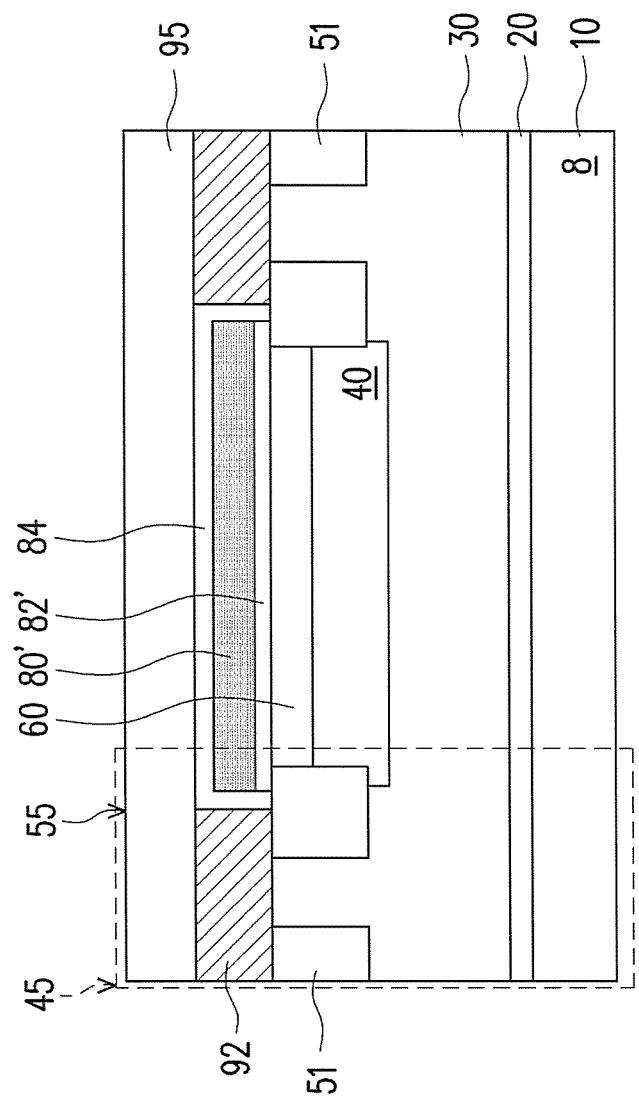
FIG. 5B is a cross-sectional view taken along the line V'-V' in FIG. 3B.

3B. FIG. 5A is a cross-sectional view taken along the line V-V in FIG. 3A. FIG. 5B is a cross-sectional view taken along the line V'-V' in FIG. 3B.

Referring to FIG. 3A, FIG. 4A and FIG. 5A, MOS transistor cells 25 comprise a drain region 10, a buffer layer 20, a drift layer 30, well regions 40, source regions 60, body regions 50, gate dielectric layers 82 and gates 80. Each MOS transistor cell 25 is disposed on a substrate 8. The substrate 8 can be a semiconductor compound substrate, such as a silicon carbide (SiC) substrate. In an embodiment, the substrate 8 comprises a 4H-SiC substrate. Each MOS transistor cell 25 can be an accumulation-mode SiC MOS transistor. The substrate 8 has a doped region of a first conductivity type, and a portion of the doped region serves as the drain region 10. In this embodiment, the doped region can be an N+ doped region having an N-type dopant. The N-type dopant comprises nitrogen, and the doping concentration thereof ranges from $5 \times 10^{18}/cm^3$ to $1 \times 10^{20}/cm^3$. The substrate 8 has a thickness of 100 μm to 350 μm, for example.

Referring to FIG. 3A, FIG. 4A and FIG. 5A, the buffer layer 20 has the first conductivity type and is disposed on the substrate 8. The buffer layer 20 can be a first semiconductor compound epitaxial layer with an N-type dopant. In this embodiment, the buffer layer 20 can be an N-type SiC epitaxial layer, the N-type dopant thereof comprises nitrogen, and the doping concentration ranges from $5 \times 10^{17}/cm^3$ to $5 \times 10^{18}/cm^3$. The buffer layer 20 has a thickness of 0.5 μm to 2 μm, for example.

Referring to FIG. 3A, FIG. 4A and FIG. 5A, the drift layer 30 has the first conductivity type and is disposed on the buffer layer 20. The drift layer 30 can be a second semiconductor compound epitaxial layer with an N-type dopant. In this embodiment, the drift layer 30 can be an N-type SiC epitaxial layer, and the N-type dopant thereof comprises nitrogen. The doping concentration of the drift layer 30 is lower than that of the buffer layer 20. The drift layer 30 has a doping concentration of $5 \times 10^{14}/cm^3$ to $5 \times 10^{16}/cm^3$. The drift layer 30 has a thickness of 5 μm to 20 μm, for example.

Referring to FIG. 3A, FIG. 4A and FIG. 5A, the well regions 40 have a second conductivity type, are disposed in the drift layer 30 and arranged in an array. In this embodiment, the well regions 40 can be P-type doped regions, the P-type dopant thereof comprises aluminium, and the doping concentration ranges from $1 \times 10^{17}/5 \times 10^{18}/cm^3$. The well regions 40 have a junction depth of 0.6 μm to 1.0 μm. The separating line 35 is at the position where the drift layer 30 is between the adjacent well regions 40.

Referring to FIG. 3A, FIG. 4A and FIG. 5A, the source regions 60 have the first conductivity type and are respectively disposed in the well regions 40. In this embodiment, the source regions 60 can be N+ doped regions, the N-type dopant thereof comprises nitrogen or phosphorous, and the doping concentration ranges from $1.0 \times 10^{19}/cm^3$ to $5.0 \times 10^{19}/cm^3$. The source regions 60 have a junction depth of 0.2 μm to 0.3 μm. The source regions 60 are disposed in the well regions 40. The source regions 60 can have various shapes. In an embodiment, each source region 60 is a rectangular ring, as shown in FIG. 2A. In another embodiment, each source region 60 is a hexagonal ring, and all source regions 60 are shaped as a honeycomb, as shown in FIG. 2B. However, the disclosure is not limited thereto. Upon the design requirement, the MOS transistor cells can be circular, elliptic or mosaic etc.

Referring to FIG. 3A, FIG. 4A and FIG. 5A, the gates 80 are disposed on the drift layer 30 at the separating line 35 and extend onto the adjacent well regions 40 and the source regions 60. The surfaces of the well regions 40 covered by the gates 80 serve as channel regions 70. Each gate 80 can be a single-layer or multi-layer structure. The gates 80 comprise a conductive material, such as metal, alloy, N-type doped polysilicon, P-type doped polysilicon, metal silicide or a combination thereof. The metal comprises Ni, Ti, Mo, Al, Pd etc. The alloy comprises TiW, NiTi etc. The metal silicide can be formed from the metal or alloy upon an appropriate heating treatment. In this embodiment, the material of the gates 80 is N-type doped polysilicon. The N-type dopant comprises phosphorous, and the doping concentration thereof ranges from $1.0 \times 10^{19}/cm^3$ to $5.0 \times 10^{19}/cm^3$. With the design layout, the gates 80 can be connected to another metal in the periphery region of the chip.

Referring to FIG. 3A, FIG. 4A and FIG. 5A, the gate dielectric layers 82 are disposed between the gates and the drift layer 30 and between the gates 80 and the well regions 40. The gate dielectric layers 82 comprise a low-k material or a high-k material. The low-k material denotes a dielectric material with a dielectric constant less than 4, such as silicon oxide or silicon oxynitride. The high-k material denotes a dielectric material with a dielectric constant greater than 4, such as $HfO_2$, $HfAlO$, $HfW_2$, $Al_2O_3$ or $Si_3N_4$.

Referring to FIG. 3A, FIG. 4A and FIG. 5A, the P+ body regions 50 (or called second-type well contact regions) have the second conductivity type and are disposed in the middle of the source regions 60 in the well regions 40. In this embodiment, the body regions 50 can be P-type doped regions, the P-type dopant thereof comprises aluminium, and the doping concentration ranges from $1.0 \times 10^{19}/cm^3$ to $5.0 \times 10^{19}/cm^3$. The body regions 50 have a junction depth of 0.4 μm to 0.6 μm. In an embodiment, the source regions 60 are rectangular rings, and the body regions 50 are rectangular bulks respectively surrounded by the source regions 60, as shown in FIG. 2A. In another embodiment, the source regions 60 are hexagonal rings, and the body regions 50 are hexagonal bulks respectively surrounded by the source regions 60, as shown in FIG. 1B. However, the shapes of the source regions 60 and the body regions 50 are not limited to the disclosure.

Referring to FIG. 3A, FIG. 4A and FIG. 5A, a passivation layer 84 covers the source regions 60, the gate dielectric layers 82 and the gates 80. The passivation layer 84 comprises silicon nitride or silicon oxide. The passivation layer 84 has contact plug openings 94 therein, and source contacts 91 are disposed within the contact plug openings 94. A conductive line 95 is disposed on the passivation layer 84 above the gates 80 and is electrically connected to the source contacts 91. The source contacts 91 and the conductive line 95 comprise metal, alloy, metal nitride or a combination thereof, such as Ti/Al stacked layer or Ti/TiN/Al stacked layer.

The gates 80 can be a trench gates 80', as shown in FIG. 3B, FIG. 4B and FIG. 5B. Referring to FIG. 3B, FIG. 4B and FIG. 5B, each trench gate 80' is disposed between the adjacent source regions 60, extends downwardly at the corresponding separating line 35, located between the adjacent well regions 40 and extends into the drift layer 30. Channel regions 70' are disposed in the well regions 40 beside the corresponding separating line 35. The gate dielectric layers 82' are disposed between the gates 80' and the source regions 60, between the gates 80' and the well regions 40 and between the gates 80' and the drift layer 30.

Referring to FIG. 3A, FIG. 3B, FIG. 4A and FIG. 5A, each area 15 has at least one JBS diode 45 herein. The at least one JBS diode 45 is disposed at the intersection region 55 of the separating lines 35 and connected in anti-parallel to the MOS transistor cells 25. Specifically, each JBS diode 45 comprises a plurality of junction barrier regions 51, the said drift later 30, an anode contact 92 and a cathode 52.

Each junction barrier region 51 has the second conductivity type and is disposed in the first layer 30 at the corresponding intersection region 55 of the separating lines 35. From another view of point, the junction barrier regions 51 are disposed in the drift layer 30 at the separating lines 35 between the gates 80 (or trench gates 80'). The junction barrier regions 51 are mainly for shielding the channel regions at corners. In an embodiment, the junction barrier regions 51 contact but not overlap with the well regions 40 in the top view. However, the disclosure is not limited thereto. The junction barrier regions 51 can have a greater area extending into the adjacent well regions 40 and/or the source regions 60. In an embodiment, the junction barrier regions 51 are disposed at the intersection regions 55 of the separating lines, further extend into the corners of the well regions 40 and contact the corners of the source regions 60. However, for certain application in which an even lower leakage of the JBS diode 45 is required, the distance between the junction barrier regions 51 can be reduced. Therefore, when the JBS diode 45 is operated with a reverse withstand voltage, a depletion region is formed so as to enhance the pinch off effect and accordingly lower the leakage. However, the turn-on current of the JBS diode 45 may be slightly reduced due to the less Schottky contact area. Therefore, upon the actual requirements and applications, the area of each JBS diode 45 can be adjusted by changing the dimension and pitch of the corresponding junction barrier regions 51. In addition, the junction barrier regions 51 can be formed simultaneously during the step of forming the body regions 50. Alternatively, the junction barrier regions 51 can be defined to be deeper by a separate photomask.

Each anode contact 92 covers a portion of the junction barrier regions and Ohmic contacts are formed therebetween (i.e. at the intersection region 55). The anode contacts 92 are electrically connected to the source contacts 91 of the MOS transistor cells 25 via the conductive line 95. The anode contacts 92 can be designed to have different shapes according to the requirements, and the shapes are not limited by the disclosure. In the embodiment of FIG. 2A, the anode contacts 92 can be quadrilateral. In the embodiment of FIG. 2B, the anode contacts 92 can be triangular. The material of the anode contacts 92 can be the same as or different from that of the source contacts 91 and/or that of the conductive line 95. The anode contacts 92 comprise metal, alloy, metal nitride or a combination thereof, such as Ti/Al stacked layer or Ti/TiN/Al stacked layer.

The cathode 52 of each JBS diode 45 can be a doped region of the first conductivity type disposed in the substrate 8 below the drift layer 30 at the intersection region 55. In this embodiment, the doped region can be an N+ doped region having an N-type dopant. The N-type dopant comprises nitrogen, and the doping concentration thereof ranges from $5 \times 10^{18}/cm^3$ to $1 \times 10^{20}/cm^3$. The cathode 52 of each JBS diode 45 is electrically connected to the drain region 10 of the MOS transistor cells 25 so as to form a common terminal.

In the said embodiments, the junction barrier regions 51 of each JBS diode 45 are disposed at the corresponding intersection region 55 of the separating lines 35, extend into the corners of the well regions 40 and contact the corners of the source regions 60, as shown in FIG. 2A and FIG. 2B. From one point of view, each JBS diode 45 replaces the corners of the adjacent MOS transistor cells 25 which have a poor characteristic. In an embodiment, each JBS diode 45 is formed by using four outer junction barrier regions 51 to surround the inner Schottky contact. The JBS diode 45 has a turn-on voltage of about 1V, which is lower than the turn-on voltage (about 2.6 V) of the built-in body diode. Therefore, the JBS diode 45 can be turned on earlier than the built-in body diode, such that the integrated device having a MOSFET cell array embedded with a JBS diode can be considered a unipolar device when it is turned on and minority carriers can be quickly removed when it is turned off. Accordingly, the integrated device can be operated in high speed.

Figure 6:
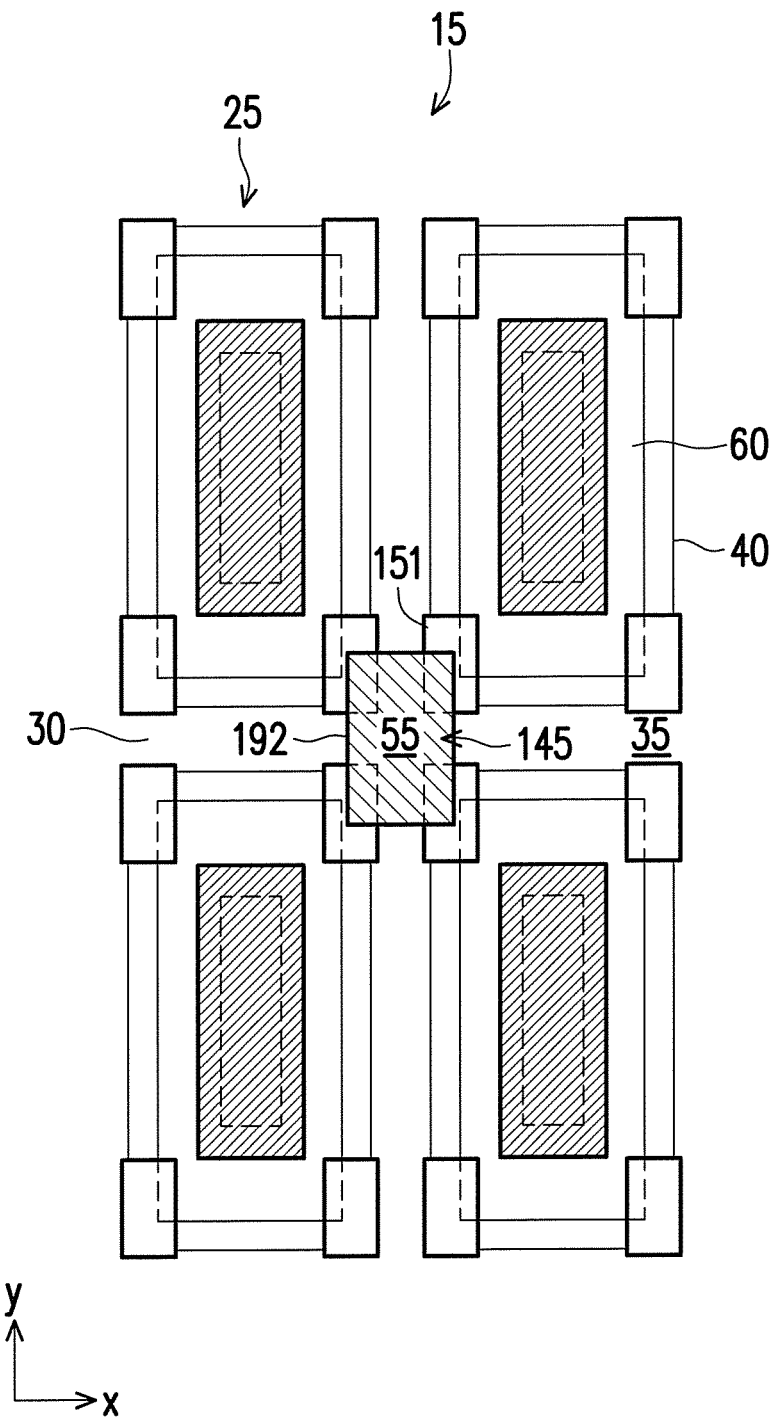
FIG. 6 is a top view of an integrated device having a MOSFET cell array embedded with a JBS diode according to another exemplary embodiment.
Figure 7:
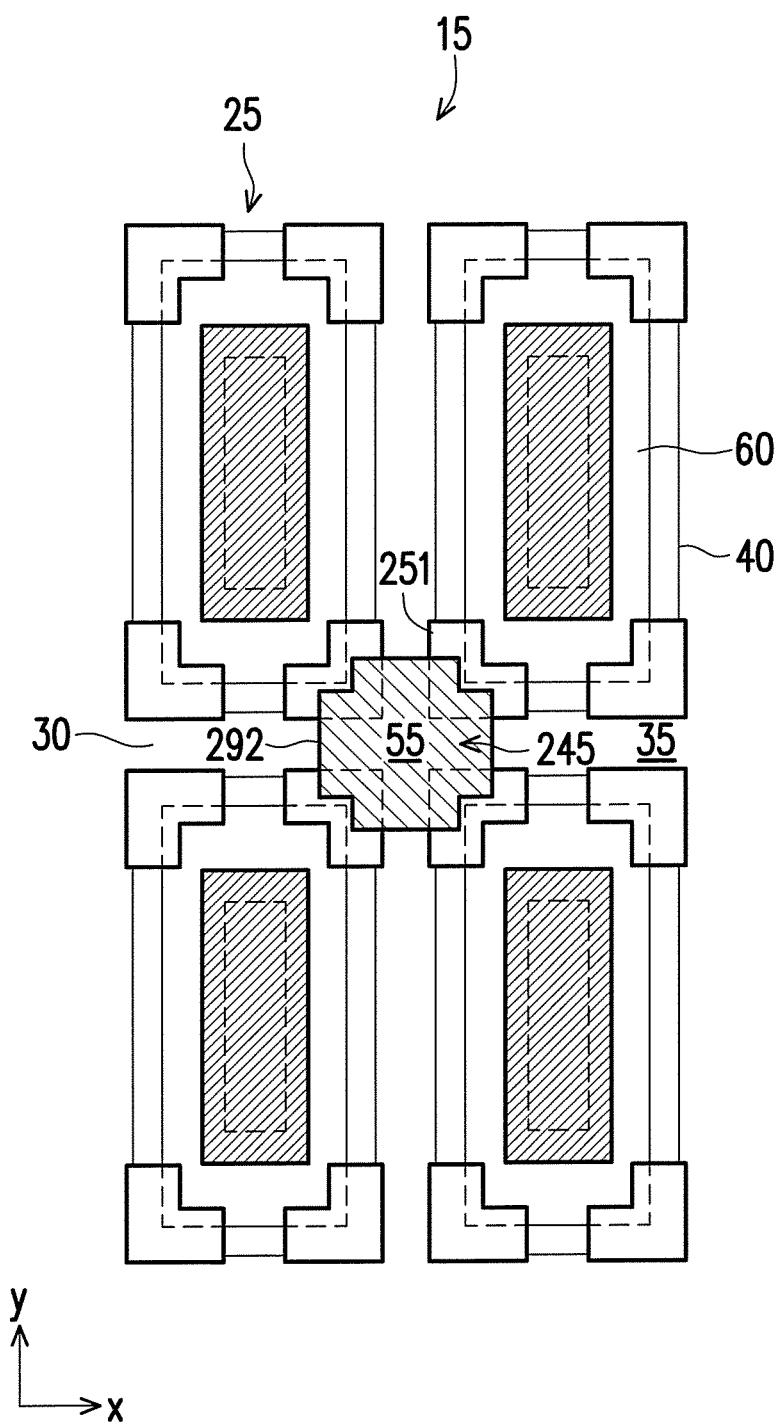
FIG. 7 is a top view of an integrated device having a MOSFET cell array embedded with a JBS diode according to yet another exemplary embodiment.
Figure 8:
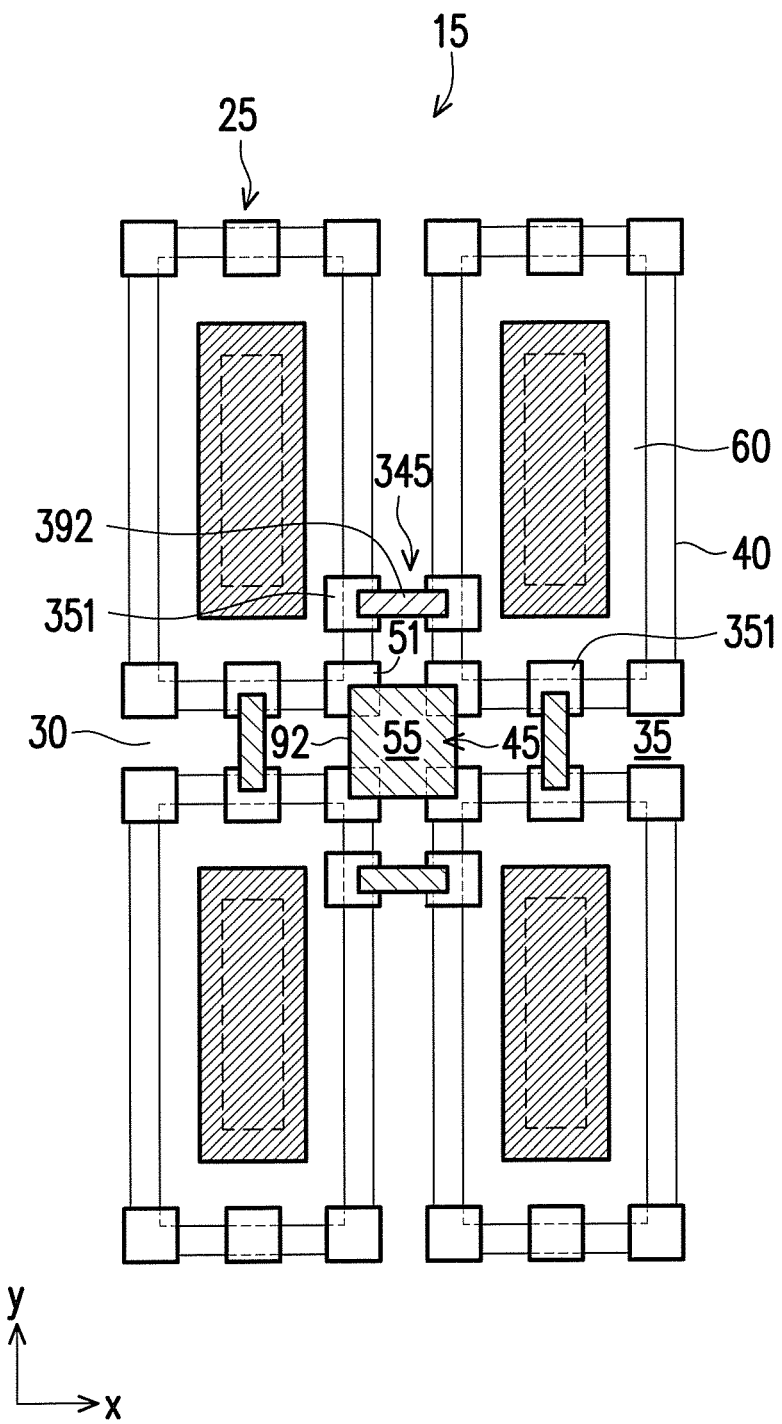
FIG. 8 is a top view of an integrated device having a MOSFET cell array embedded with a JBS diode according to still another exemplary embodiment.

FIG. 6 is a top view of an integrated device having a MOSFET cell array embedded with a JBS diode according to another exemplary embodiment. FIG. 7 is a top view of an integrated device having a MOSFET cell array embedded with a JBS diode according to yet another exemplary embodiment. FIG. 8 is a top view of an integrated device having a MOSFET cell array embedded with a JBS diode according to still another exemplary embodiment. For clarity of illustration, FIG. 6, FIG. 7 and FIG. 8 are simplified, in which the JBS diode is illustrated only at the center of each area 15. The JBS diodes 45, 145, 245, 345 can be positioned not only at the intersection regions 55 of the separating lines 35 in the same area 15, but also at the intersection regions 55 of the separating lines 35 between the adjacent MOS transistor cells 25 in the adjacent areas 15, as shown in FIG. 1A and FIG. 1B.

Referring to FIG. 6, in an embodiment, the junction barrier regions 151 of the JBS diode 145 is disposed at the intersection region 55 of the separating lines 35, extend into the corners of the adjacent wells 40 and contact the corners of the source regions 60. Besides, the junction barrier regions 151 further extend to a single edge of each of the corresponding well regions 40, so as to increase the Schottky contact area of the corresponding anode contact 192. The anode contact 192 covers a portion of the junction barrier regions 151 and the drift layer 30 (i.e. at the separating lines 35) between the junction barrier regions 151, and is shaped as a rectangle.

Referring to FIG. 7, in another embodiment, the junction barrier regions 251 of the JBS diode 245 is disposed at the intersection region 55 of the separating lines 35, extend into the corners of the adjacent wells 40 and contact the corners of the source regions 60. Besides, the junction barrier regions 251 further extend to multiple edges of each of the corresponding well regions 40, so as to increase the Schottky contact area of the corresponding anode contact 292. The anode contact 292 covers a portion of the junction barrier regions 251 and the drift layer 30 (i.e. at the separating lines 35) between the junction barrier regions 251, and is shaped as a cross.

Referring to FIG. 8, in yet another embodiment, in addition to at least one JBS diode 45, each area 15 further comprises a plurality of JBS diodes 345. Each JBS diode 345 comprises a plurality of junction barrier regions 351, an anode contact 392, a drift layer 30 and a cathode (not shown). The junction barrier regions 351 are arranged in segments at intervals, disposed at the separating lines 35 and at the edges of the adjacent well regions 40. Besides, the junction barrier regions 351 further extend into the adjacent well regions 40 and source regions 60. The anode contacts 392 cover a portion of the junction barrier regions 351 and the drift layer 30 (i.e. at the separating lines 35) between the junction barrier regions 351.

In the above-mentioned embodiments, the first conductivity type is N-type and the second conductivity type is P-type, but the disclosure is not limited thereto.

The said embodiments in which at least one JBS diode is disposed at an intersection region of separating lines or at edges of the well regions adjacent to the separating lines are provided for illustration purposes, and are not construed as limiting the disclosure. The at least one JBS diode can be disposed at any position in the chip where the variation of the process (e.g. ion implantation or photolithography) occurs due to geometric symmetry. Therefore, the uniformity and stability of the MOS switching property can be greatly enhanced.

Besides, in the embodiments of the disclosure, at least one JBS diode is integrated to a MOS transistor cell array, and the JBS diode is connected in anti-parallel to the MOS transistor cells. The JBS diode can replace the built-in body diode so as to reduce the turn-on voltage (or decrease the turn-on loss) and increase the switching speed. Further, in the embodiments of the disclosure, the JBS diode is disposed at the corners of the adjacent MOS transistor cells which have a poor threshold voltage (Vt) characteristic, so as to enhance the turn-on uniformity of the device. In addition, the JBS diode is not required to occupy the whole area of a MOS transistor cell. The area of the JBS diode can be adjusted upon the actual requirements, so as to improve the matching property between the operating current of the JBS diode and the operating current of the MOS transistor cell. Moreover, in the embodiments of the disclosure, the MOSFET and the JBS diode are integrated in a single chip, without additional separate wirings for the power module. Accordingly, the technical difficulty of the power module assembly is greatly reduced, the low yield and high stray inductance caused by the wiring packaging are improved, and the production cost can be decreased.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An integrated device having a metal oxide semiconductor field effect transistor (MOSFET) cell array embedded with a junction barrier Schottky (JBS) diode, comprising a plurality of areas, each area comprising:
    a plurality of MOS transistor cells, wherein any two adjacent MOS transistor cells are separated by a separating line, and wherein a first MOS transistor cell and a second MOS transistor cell are adjacent in a first direction and separated by a first separating line, and the first transistor cell and a third MOS transistor cell are adjacent in a second direction and separated by a second separating line, wherein the MOS transistor cells of each area comprises a plurality of well regions of a second conductivity type, and any two adjacent well regions are separated by one of the separating lines;
    a drift layer of the first conductivity type, disposed on a substrate, wherein the well regions are disposed in the drift layer;
    at least one JBS diode, disposed in the drift layer at an intersection region between the first separating line and the second separating line, and overlapping with the well regions, wherein the JBS diode is connected in anti-parallel to the first, second and third MOS transistor cells, wherein the at least one JBS diode comprises a plurality of first junction barrier regions of the second conductivity type, and the plurality of first junction barrier regions extend into corners of the well regions of the second conductivity type;
    a plurality of source regions of a first conductivity type, disposed in the well regions;
    a plurality of body regions of the second conductivity type, disposed in the middle of the source regions in the well regions;
    a plurality of source contacts, disposed on and electrically connected to the body regions and a portion of the source regions;
    a first anode contact, covering a portion of the first junction barrier regions and a portion of the drift layer and electrically connected to the source contacts and the first junction barrier regions; and
    a cathode, disposed in the substrate below the drift layer.

2. The integrated device of claim 1, wherein the MOS transistor cells of each area further comprises:
    a plurality of gates, respectively disposed on the separating lines and extending onto the adjacent well regions and the source regions.

3. The integrated device of claim 2, wherein the MOS transistor cells of each area further comprises:
    a drain region of the first conductivity type, disposed in the substrate; and
    a plurality of gate dielectric layers, disposed between the gates and the drift layer and between the gates and the well regions.

4. The integrated device of claim 3, wherein the gates further extend into the drift layer at the separating lines.

5. The integrated device of claim 1, wherein the first conductivity type is N-type and the second conductivity type is P-type.

6. The integrated device of claim 1, wherein the first junction barrier regions further extend to contact the source regions.

7. The integrated device of claim 1, wherein at least one of the first junction barrier regions extend into a single edge of one of the well regions.

8. The integrated device of claim 1, wherein at least one of the first junction barrier regions extend into multiple edges of one of the well regions.

9. The integrated device of claim 1, wherein the at least one JBS diode of each area further comprises:
    a plurality of second junction barrier regions, disposed at edges of the well regions; and
    a plurality of anode contact, covering a portion of the second junction barrier regions and a portion of the drift layer.

10. The integrated device of claim 1, wherein in each area, the plurality of MOS transistor cells comprises three MOS transistor cells.

11. The integrated device of claim 1, wherein in each area, the plurality of MOS transistor cells comprises four MOS transistor cells.

12. The integrated device of claim 1, wherein in each area, an area of the JBS diode is less than an area of each of the MOS transistor cells.

13. The integrated device of claim 1, wherein the MOS transistor cells comprise silicon carbide MOS transistor cells.

14. The integrated device of claim 1, wherein an area of the JBS diode is less than an area of each of the MOS transistor cells.

15. The integrated device of claim 14, wherein the area of the JBS diode is ¼ to ½ the area of each of the MOS transistor cells.

16. The integrated device of claim 1, wherein a plurality of upper surfaces of the well regions and a plurality of upper surfaces of the first junction barrier regions are coplanar.

17. The integrated device of claim 1, wherein a portion of a bottom surface of each first junction barrier region is not covered by an adjacent well region.

* * * * *